United States Patent
Park

(10) Patent No.: US 10,381,540 B2
(45) Date of Patent: Aug. 13, 2019

(54) THERMOELECTRIC MODULE AND HEAT CONVERTER INCLUDING THE SAME

(71) Applicant: LG INNOTEK CO., LTD., Seoul (KR)

(72) Inventor: Chan Yeong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 275 days.

(21) Appl. No.: 15/142,356

(22) Filed: Apr. 29, 2016

(65) Prior Publication Data

US 2016/0322555 A1 Nov. 3, 2016

(30) Foreign Application Priority Data

Apr. 30, 2015 (KR) .................. 10-2015-0062134

(51) Int. Cl.

| | | |
|---|---|---|
| H01L 35/32 | (2006.01) | |
| H01L 35/10 | (2006.01) | |
| H01L 23/00 | (2006.01) | |
| H01L 35/04 | (2006.01) | |
| H01L 35/14 | (2006.01) | |
| H01L 35/00 | (2006.01) | |

(52) U.S. Cl.
CPC ............ *H01L 35/325* (2013.01); *H01L 24/32* (2013.01); *H01L 35/00* (2013.01); *H01L 35/04* (2013.01); *H01L 35/10* (2013.01); *H01L 35/14* (2013.01)

(58) Field of Classification Search
CPC ........ H01L 35/10; H01L 35/32; H01L 35/325
See application file for complete search history.

(56) References Cited

U.S. PATENT DOCUMENTS

| | | | | |
|---|---|---|---|---|
| 2007/0028955 A1* | 2/2007 | Sogou | ..................... | H01L 35/10 136/200 |
| 2011/0259385 A1* | 10/2011 | Hiroyama | ............... | H01L 35/10 136/205 |
| 2011/0265838 A1* | 11/2011 | Kambe | .................... | H01L 35/30 136/223 |
| 2013/0061900 A1* | 3/2013 | Tachibana | ............... | H01L 35/30 136/203 |
| 2013/0174891 A1* | 7/2013 | Tseng | ..................... | F24J 2/5211 136/251 |

* cited by examiner

*Primary Examiner* — Edward J. Schmiedel
(74) *Attorney, Agent, or Firm* — Ked & Associates, LLP

(57) ABSTRACT

A thermoelectric module with high efficiency is provided. The thermoelectric module may include a first substrate including a plurality of first electrodes, a second substrate provided opposite the first substrate and including a plurality of second electrodes, a plurality of thermoelectric devices provided between the first substrate and the second substrate and electrically connected to the first electrodes and the second electrodes, and a wire connection hole configured to penetrate through at least one of the first substrate and the second substrate and expose a portion of at least one surface of the first electrodes and the second electrodes.

9 Claims, 8 Drawing Sheets

THERMOELECTRIC MODULE AND HEAT CONVERTER INCLUDING THE SAME

CROSS-REFERENCE TO RELATED APPLICATION

This application claims priority under 35 U.S.C. § 119 to Korean Patent Application No. 10-2015-0062134, filed on Apr. 30, 2015, whose entire disclosure is incorporated herein by reference.

BACKGROUND

1. Field

Embodiments relate to a thermoelectric module and a heat converter including a thermoelectric module.

2. Background

A thermoelectric device including a heat converter may have a structure in which a PN junction pair is formed by connecting a P-type thermoelectric material and an N-type thermoelectric material between metal electrodes. When a temperature difference occurs between the PN junction pair, power may be generated through the Seebeck effect, and the thermoelectric device may function as an electricity generator. Through the Peltier effect, in which one side of the PN junction pair is cooled and the other side is heated, the thermoelectric device may be used as a temperature controller.

The thermoelectric device may be applied to a device for cooling or heating or an apparatus for power generation and may utilize various thermoelectric effects. Thus, attention has been directed towards methods which can increase efficiency of the thermoelectric device. Because thermoelectric devices may be provided between a pair of substrates that may be opposite each other, there may be a space restriction, and a method of enhancing efficiency of a thermoelectric module by enlarging an area in which thermoelectric devices are provided may be required.

BRIEF DESCRIPTION OF THE DRAWINGS

The embodiments will be described in detail with reference to the following drawings in which like reference numerals refer to like elements wherein.

DETAILED DESCRIPTION

Figure 1:
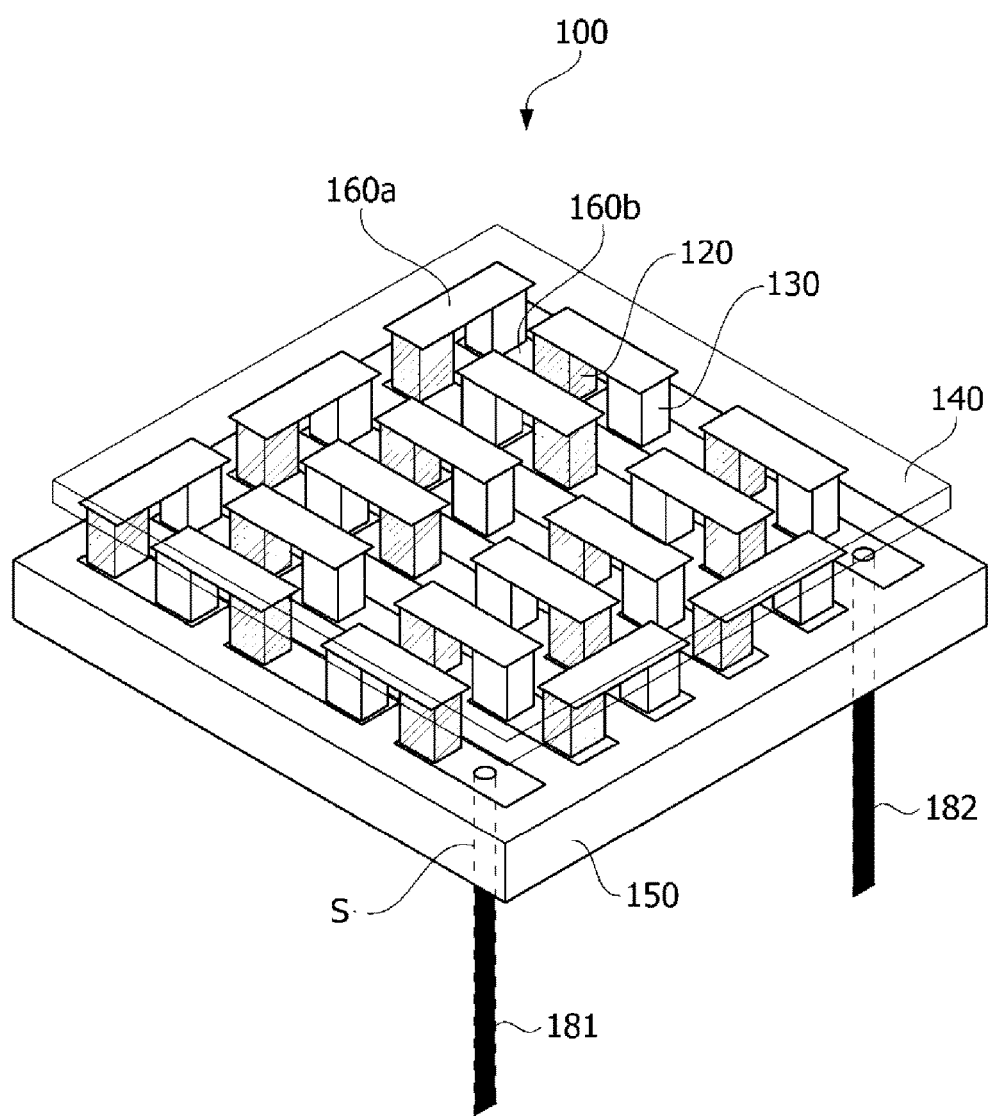
FIG. 1 is a conceptual diagram of a portion of a thermoelectric module according to an embodiment.
Figure 2:
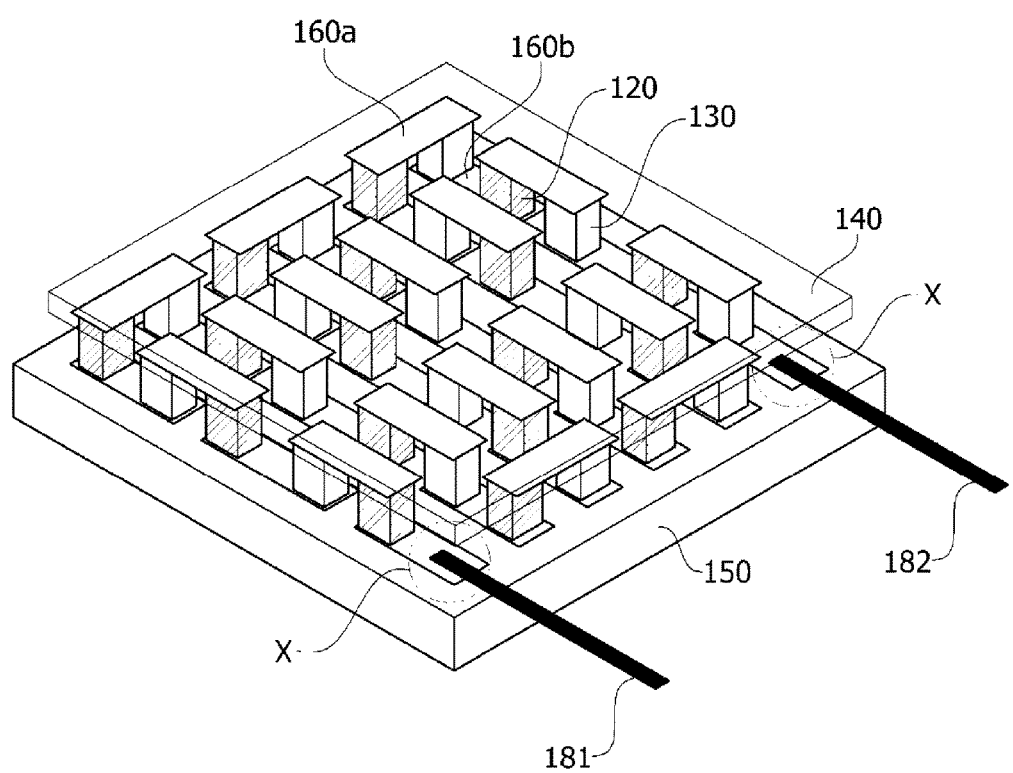
FIG. 2 is a comparative conceptual diagram of a portion of a thermoelectric module.

Referring to FIG. 1, a thermoelectric module 100 according to an embodiment may include a first substrate 140 including a plurality of first electrodes 160a, a second substrate 150 provided opposite the first substrate 140 and including a plurality of second electrodes 160b, a plurality of thermoelectric devices 120 and 130 provided between the first substrate 140 and the second substrate 150 and electrically connected to the first electrodes 160a and the second electrodes 160b, a wire connection hole S configured to penetrate at least one of the first substrate 140 and the second substrate 150 and expose a portion of at least one surface of the first electrodes 160a and the second electrodes 160b, and wires 181 and 182 connected to one surface of the first electrode 160a or the second electrode 160b exposed by the wire connection hole S and pulled out to the outside through the wire connection hole S. In the thermoelectric module 100 according to FIG. 1, wires 181 and 182 may be pulled out under a substrate, as compared to FIG. 2 where wires 181 and 182 that apply a power source may be inserted into and combined with a thermoelectric module. As shown in FIG. 2, there may be room for additional thermoelectric devices in region X, which may be restricted by a configuration of the wires 181 and 182 in FIG. 2 but is more accessible in the thermoelectric module 100 according to FIG. 1. Therefore, thermoelectric capability may be greatly increased in the embodiment according to FIG. 1 compared to that of FIG. 2.

For example, the wire connection hole S of the thermoelectric module 100 according to the embodiment may include a pair of wire connection holes S exposing respective different electrodes. The wire connection hole S may penetrate through a top surface to a bottom surface of a substrate. Therefore, a bottom surface of an electrode formed on the top surface of the substrate may be exposed by the wire connection holes S. Both of the pair of wire connection holes S may be formed in the first substrate 140 or in the second substrate 150. Alternatively, one hole of the pair of wire connection holes S may be formed in the first substrate 140, and another hole of the wire connection holes S may be formed in the second substrate 150. For convenience of description, a pair of wire connection holes S formed in the second substrate 150 is described as an example, but the embodiments are not limited thereto.

An insulation layer may be formed on an inner wall of the wire connection hole S. Therefore, even when sheaths of the wires 181 and 182 are peeled off, the wires 181 and 182 may be insulated from the substrate. The pair of wire connection holes S may expose respective different types of thermoelectric devices. For example, the pair of wire connection holes S may expose a portion of one surface of an electrode connected to the first semiconductor device 120 and a portion of one surface of an electrode connected to the second semiconductor device 130. One of the first semiconductor device 120 and the second semiconductor device 130 may be a P-type thermoelectric device, and another may be an N-type thermoelectric device. The first semiconductor device 120 may be used with a P-type thermoelectric device, a P-type semiconductor device, and/or a P-type thermoelectric semiconductor. The second semiconductor device 130 may be used with an N-type thermoelectric device, an N-type semiconductor device, and/or an N-type thermoelectric semiconductor.

Each wire connection hole S may be a hole that penetrates through a top surface to a bottom surface of a substrate. Further, one end of each of the wires 181 and 182 may be bonded to the second electrode 160b, whose one surface is exposed by the wire connection hole S, and another end of each of the wires 181 and 182 may be formed to be exposed outside the second substrate 150 through the wire connection hole S. According to the embodiment, without a structure shown in FIG. 2 in which the wires 181 and 182 are inserted between the first substrate 140 and the second substrate 150, the wires 181 and 182 may be directly connected to electrodes from a lower portion of the substrate. Therefore, more thermoelectric devices may be provided between the first substrate 140 and the second substrate 150, and space may be better utilized.

Figure 3A:
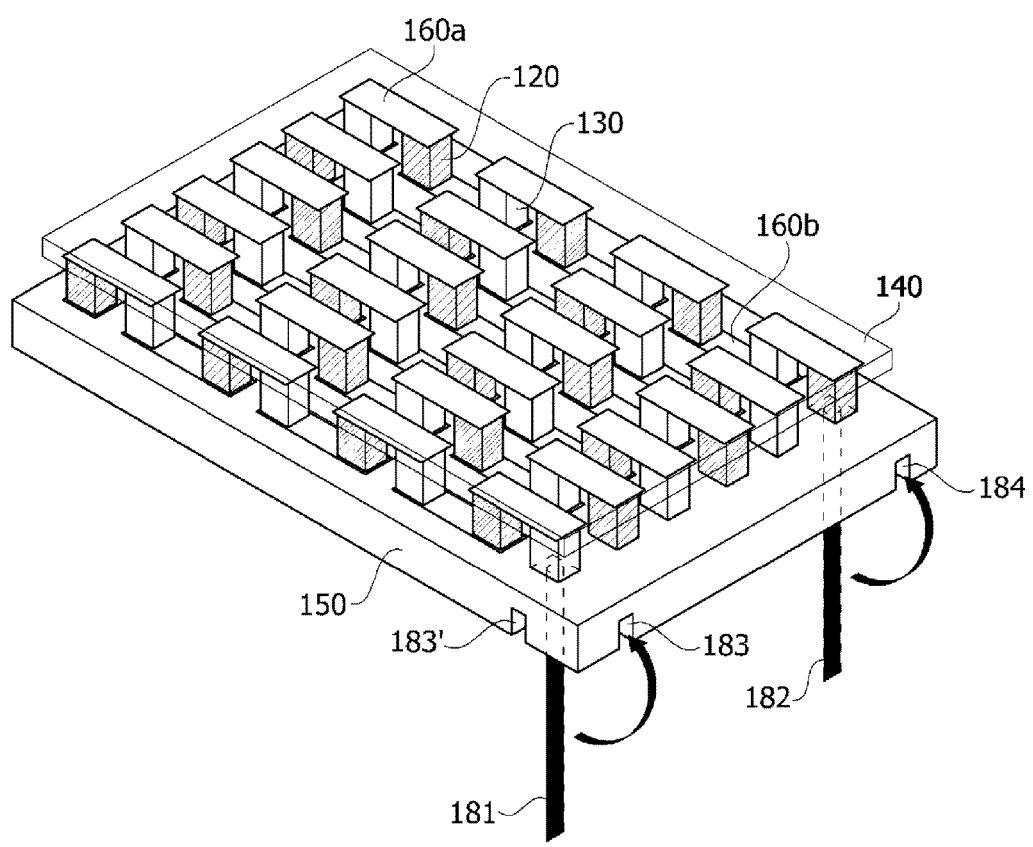
FIG. 3A is a perspective view of a structure including a wire connection hole illustrated in FIG. 1 and a thermoelectric device provided on the wire connection hole.
Figure 3B:
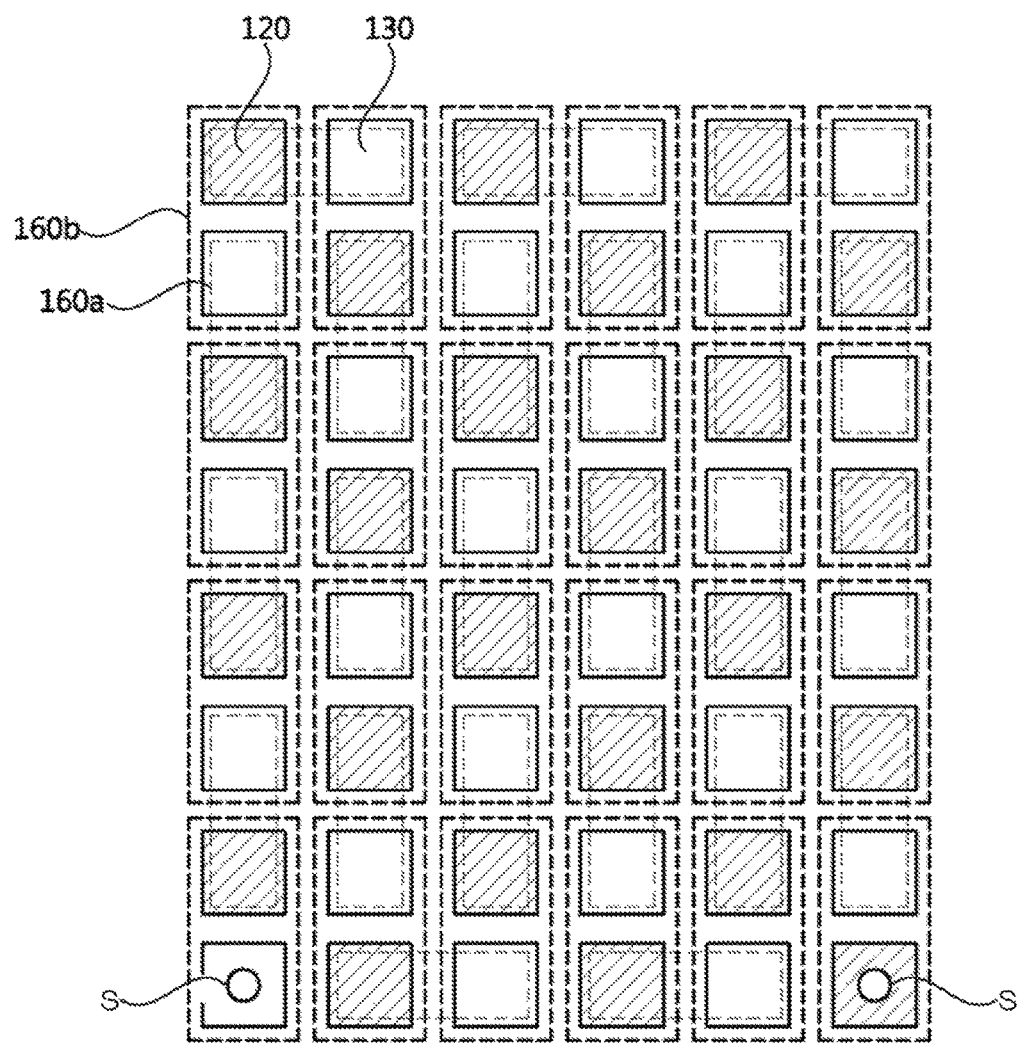
FIG. 3B is a top plan view of FIG. 3A.

Referring to FIGS. 3A and 3B, due to a thermoelectric module including the wire connection hole S formed in the second substrate 150, thermoelectric devices may be provided on or at a portion or an empty space corresponding to X shown in FIG. 2. Both of a P-type thermoelectric device and an N-type thermoelectric device may be provided on each electrode exposed by the wire connection hole S and to which the wires 181 and 182 may be connected. Accordingly, an overall number of thermoelectric devices provided may be increased, and thermoelectric efficiency may be enhanced.

As shown in FIG. 3A, the thermoelectric module may further include guide grooves 183 and 184 that communicate with the wire connection hole S in the second substrate 150. Each of the guide grooves 183 and 184 may have a structure in which a groove is formed in a bottom surface of the second substrate 150, in a direction from the bottom surface to a top surface of the second substrate 150, and may guide the wires 181 and 182 pulled out through the wire connection hole S to a side surface of the second substrate 150 by inserting or placing the wires 181 and 182 in the groove. This structure of the groove may be implemented by forming a hole in a side surface portion of the second substrate 150 with a structure open to a lower portion of the second substrate 150.

Therefore, the wires 181 and 182 may not hang down from the lower portion of the second substrate 150, but may be inserted or placed on the bottom surface of the second substrate 150 and guided to a side direction, and a portion of the wires 181 and 182 may be fixed to the second substrate 150. Thus, the wires 181 and 182 may not easily detach from an electrode by a force vertically exerted downward, and a coupling force between the wire and the electrode may be strengthened. As shown in FIG. 3A, these guide grooves 183 and 184 may be formed from the wire connection hole S to the side surface of the second substrate 150, and more than one guide groove 183 and 183' may be formed with respect to one wire connection hole S. For example, the guide groove 183 formed from the wire connection hole S in a direction toward a front surface of the thermoelectric module 100 and the guide groove 183' formed from the wire connection hole S in a direction toward a side surface of the thermoelectric module 100 may be formed. The wire 181 pulled out from the lower portion of the second substrate 150 may be guided along the guide groove 183 or the guide groove 183', and accordingly, a degree of freedom in wiring design may be enhanced.

To further improve the coupling force, the guide grooves 183 and 184 may have a winding connection path with a bending portion rather than a straight line structure on the bottom surface of the second substrate 150. Depending on an elasticity of a sheath of the wires 181 and 182, widths of the guide grooves 183 and 184 may be formed smaller than a diameter of the wire connection hole S. Therefore, when the wires 181 and 182 are insertion-coupled to or placed in the guide grooves 183 and 184, stronger coupling force may be implemented.

Figure 4:
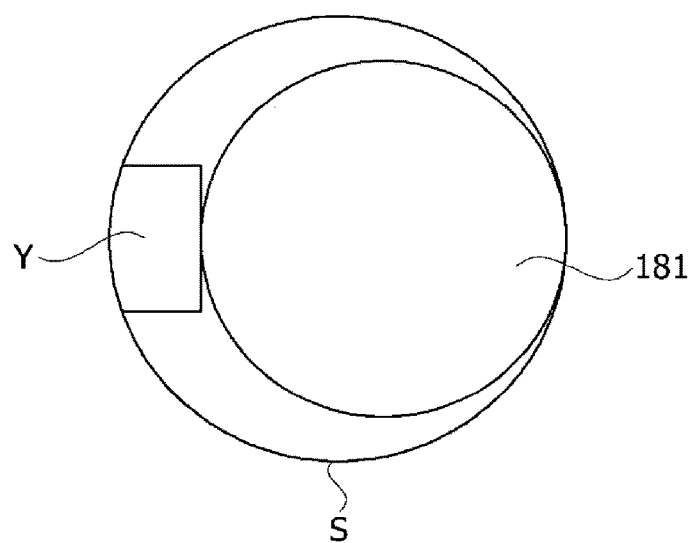
FIG. 4 is a structural conceptual diagram of a portion of a thermoelectric module according to an embodiment.

Together with the guide grooves 183 and 184 described above or independent of the guide grooves 183 and 184, the thermoelectric module may include a protrusion-type support pattern or protrusion Y inside the wire connection hole S or in the guide grooves 183 and 184 as shown in FIG. 4.

The support pattern Y may apply support to the wires 181 and 182 themselves using the elasticity of the sheath of the wires 181 and 182 passing through an inside of the wire connection hole S, and therefore may strengthen the support so that the wires 181 and 182 may not move in a vertical or lateral direction.

Referring to FIG. 1, for the first substrate 140 and the second substrate 150 provided opposite each other described above and applied to the thermoelectric module according to the embodiment, an insulating substrate, such as, e.g., an alumina substrate or flexible polymer resin, may be used. Alternatively, high radiation efficiency and slimness may be implemented using a metal substrate for the first substrate 140 and the second substrate 150. When the metal substrate is used, a special dielectric layer may be further included and formed on a contact surface between the first electrode 160a and the second electrode 160b included in the first substrate 140 and the second substrate 150. Furthermore, the wire connection hole S may be insulated through an insulating layer. In the metal substrate, Cu or a Cu alloy, Cu—Al alloy, or the like may be applied. Further, the substrate may include a flexible substrate. The substrate may use various insulating resinous materials including polyimide (PI), polystyrene (PS), polymethyl methacrylate (PMMA), circular olefin co-polymer (COC), polyethylene terephthalate (PET), high transmission plastic such as resin, etc.

The first substrate 140 and the second substrate 150 may be formed so that an area of a substrate on a radiation side among the first substrate 140 and the second substrate 150 may have a range of 1.2 to 5 times compared to an area of the remaining substrate, and therefore, volumes may be different from each other. That is, even in FIG. 1, the first substrate 140 and the second substrate 150 may be formed so that a width of the first substrate 140 is smaller than a width of the second substrate 150, and in this case, areas of substrates having the same thickness may be formed differently from each other, and volumes may be different from each other. Accordingly, a radiation performance of the thermoelectric module may be enhanced.

A radiation pattern, for example, an embossed pattern, may be formed on a surface of a radiation-side substrate among the first substrate 140 and the second substrate 150 so that a radiation property may be maximized. Therefore, even when a structure of a heat sink is removed, more efficient radiation may be obtained. The radiation pattern may be formed on one or each surface of the radiation-side substrate. When the radiation pattern is formed on a surface in contact with the first semiconductor and the second semiconductor, the radiation property and a junction property of a thermoelectric device and a substrate may be enhanced. The first substrate 140 and the second substrate 150 may be formed so that a thickness of a cold side or heat absorbing side of the substrate 140, 150 is smaller than a thickness of a remaining side of the substrate 140,150, and therefore, an inflow of heat at the cold side may be easy and a heat transfer rate may be enhanced.

The first electrode 160a and the second electrode 160b may electrically connect the first semiconductor device 120 and the second semiconductor device 130 as the thermoelectric devices using an electrode material such as Cu, Ag, Ni, etc. A thickness of the electrode layer may be formed in the range of about 0.01 to 0.3 mm, for example, in the range of 10 to 20 μm.

The first semiconductor device 120 and the second semiconductor device 130 may be formed on one electrode, and when connected in plurality, may become modularized as shown in FIGS. 3A and 3B. For example, the first semiconductor device 120 and the second semiconductor device 130 may adopt a semiconductor device formed in a bulk-type applying a P-type semiconductor material or an N-type semiconductor material. The bulk-type may be a structure formed by pulverizing an ingot, which is a semiconductor material, performing a refining ball-mill process, and then cutting a sintered structure. This bulk-type device may be formed in one integrated structure.

The N-type semiconductor material may be formed using a mixture mixed with a main source material formed of a bismuth-telluride (BiTe) based material including selenium (Se), nickel (Ni), aluminum (Al), copper (Cu), silver (Ag), lead (Pb), boron (B), gallium (Ga), tellurium (Te), bismuth (Bi), or indium (In), and Bi or Te corresponding to 0.001 to 1.0 weight percent of an overall weight of the main source material. For example, the main source material may be a Bi—Se—Te material and Bi or Te may be added by 0.001 to 1.0 weight percent of an overall weight of the Bi—Se—Te material to form the N-type semiconductor material. When a weight of 100 g of the Bi—Se—Te material is input, additionally mixed Bi or Te may be input in the range of 0.001 to 1.0 g. When this range of value is met, a semiconductor material having a high figure of merit (ZT) may be obtained.

The P-type semiconductor material may be formed using a mixture mixed with a main source material formed of a bismuth-telluride (BiTe) based material including antimony (Sb), nickel (Ni), aluminum (Al), copper (Cu), silver (Ag), lead (Pb), boron (B), gallium (Ga), tellurium (Te), bismuth (Bi), or indium (In), and Bi or Te corresponding to 0.001 to 1.0 weight percent of the overall weight of the main source material. For example, the main source material may be a Bi—Sb—Te material and Bi or Te may be added by 0.001 to 1.0 weight percent of the overall weight of the Bi—Sb—Te material to form the P-type semiconductor material. When a weight of 100 g of the Bi—Sb—Te material is input, additionally mixed Bi or Te may be input in the range of 0.001 to 1.0 g. When this range of value is met, a semiconductor material having a high figure of merit (ZT) may be obtained.

The thermoelectric device may be formed so that the first substrate 140 and the second substrate 150 may have different volumes, as well as the structure of FIG. 1. The term 'volume' may refer to an inner volume formed by a circumferential surface of the substrate. In this thermoelectric device, the first semiconductor device 120 may include a P-type semiconductor device and the second semiconductor device 130 may include an N-type semiconductor device, the first semiconductor device 120 and the second semiconductor device 130 may be connected to the metal electrodes 160*a* and 160*b* and may be formed in plurality. Therefore, the Peltier effect may be implemented through the conductive member that supplies a current to the semiconductor device through an electrode.

The thermoelectric device may have a three-dimensional structure of a rectangular parallelepiped or a cubic as shown in FIG. 1 or a structure having a same width, for example, a cylindrical shape. Alternatively, the thermoelectric device may have a structure as shown in FIG. 5.

Figure 5:
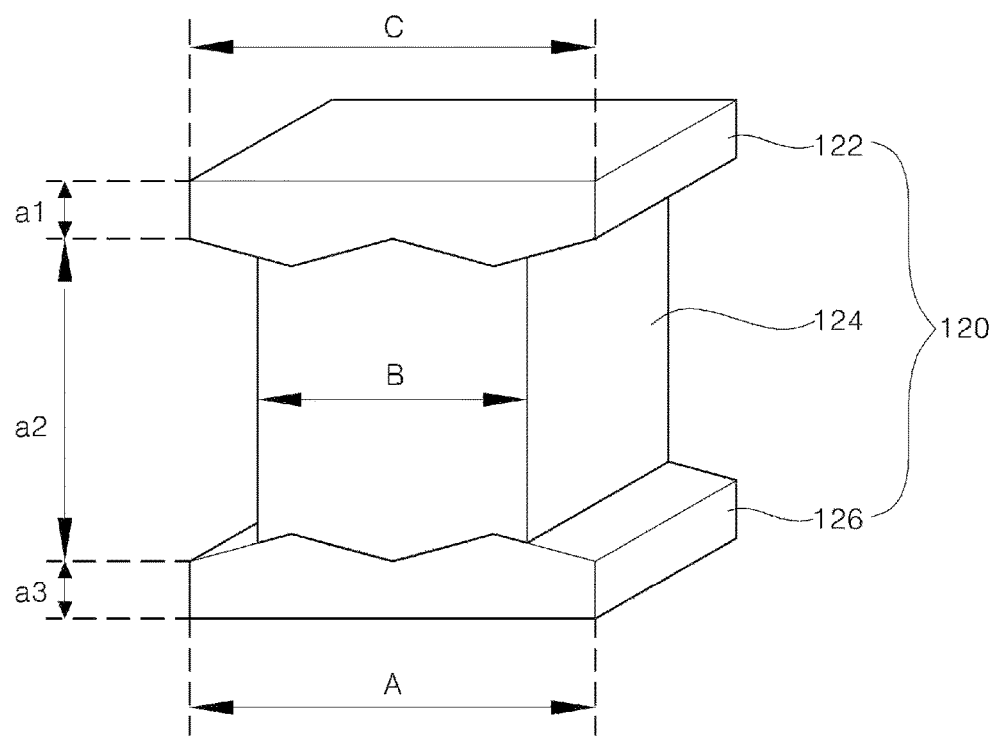
FIGS. 5 to 7 are conceptual diagrams of modified examples of a thermoelectric module according to embodiments.

The thermoelectric device applied to the thermoelectric module, as shown in FIG. 5, may be implemented so that a width of a portion in contact with exposed surfaces of the first electrode 160*a* and the second electrode 160*b* respectively accommodated on the first substrate 140 and the second substrate 150 may be wide. With reference to FIG. 5, the thermoelectric device 120 may be implemented as a structure including a first device unit 122 having a first cross-sectional area, a second device unit 126 having a second cross-sectional area and provided at a position opposite the first device unit 122, and a connection unit 124 having a third cross-sectional area and connecting the first device unit 122 and the second device unit 126. The third cross-sectional area in an arbitrary region of the connection unit 124 in a horizontal direction may be smaller than the first cross-sectional area and the second cross-sectional area.

In the above structure, when a thermoelectric device of a structure having a single cross-sectional area, like a cubic structure, and the same amount of materials are applied, areas of the first device unit 122 and the second device unit 126 may widened and a length of the connection unit 124 may be lengthened. Therefore, a temperature difference ($\Delta T$) between the first device unit 122 and the second device unit 126 may be enlarged or increased. When the temperature difference is increased, an amount of free electrons moving between a hot side and a cold side may increase, an amount of electricity generated may increase, and cooling or heating efficiency may be enhanced.

In the thermoelectric device 120, horizontal cross-sectional areas of the first device unit 122 and the second device unit 126, which may be of a planar shape or another three-dimensional structure on an upper portion and a lower portion of the connection unit 124, may be large, and a cross-sectional area of the connection unit 124 may be decreased by increasing a length of the connection unit 124. For example, a ratio of a width B of a cross-section having a greatest width of horizontal cross-sections of the connection unit 124 and a width A or C of a cross-section having a greater cross-sectional area among the horizontal cross-sectional areas of the first device unit 122 and the second device unit 126 may be in the range of 1:1.5 to 1:4. When this value range is met, electricity generation, heating, and cooling may be enhanced.

The thermoelectric device 120 may also be formed so that thicknesses a1 and a3 in a length direction of the first device unit 122 and the second device unit 126 may be smaller than a thickness a2 in a length direction of the connection unit 124. The first cross-sectional area, which may be a cross-sectional area in a horizontal direction of the first device unit 122, may be different from the second cross-sectional area, which may be a cross-sectional area in a horizontal direction of the second device unit 126 to adjust thermoelectric efficiency so as to easily control a wanted temperature difference. Further, the first device unit 122, the second device unit 126, and the connection unit 124 may be an integrated structure, and in this case, may be of a same material.

Figure 6:
Figure 6:
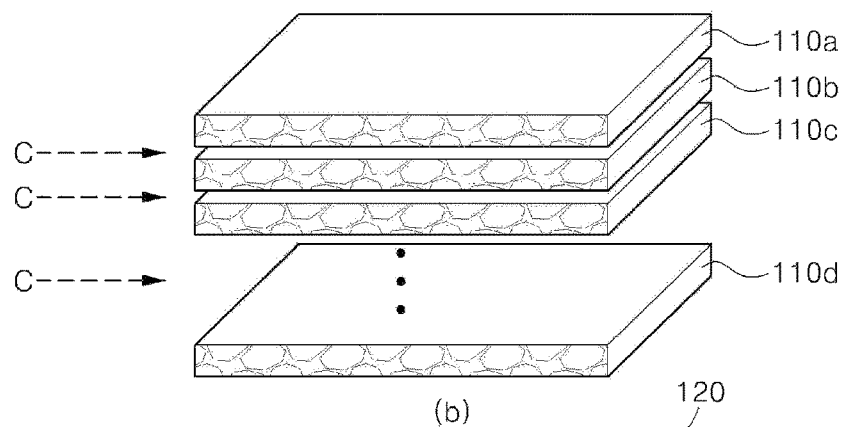
Figure 6:
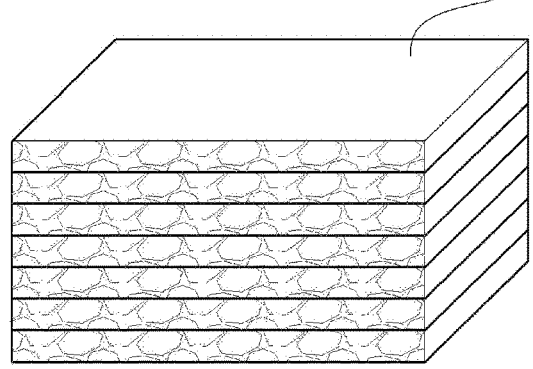
Figure 6:
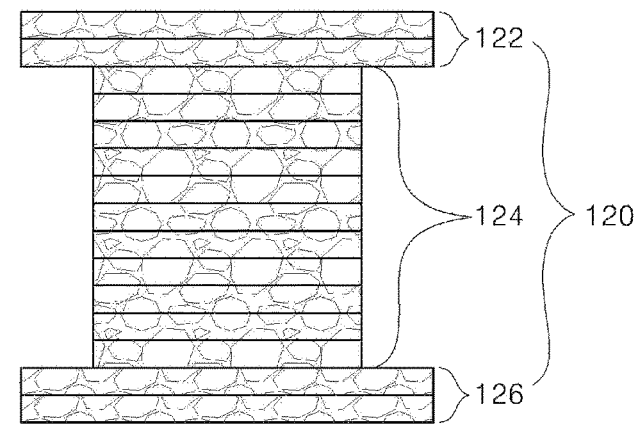
Figure 7:
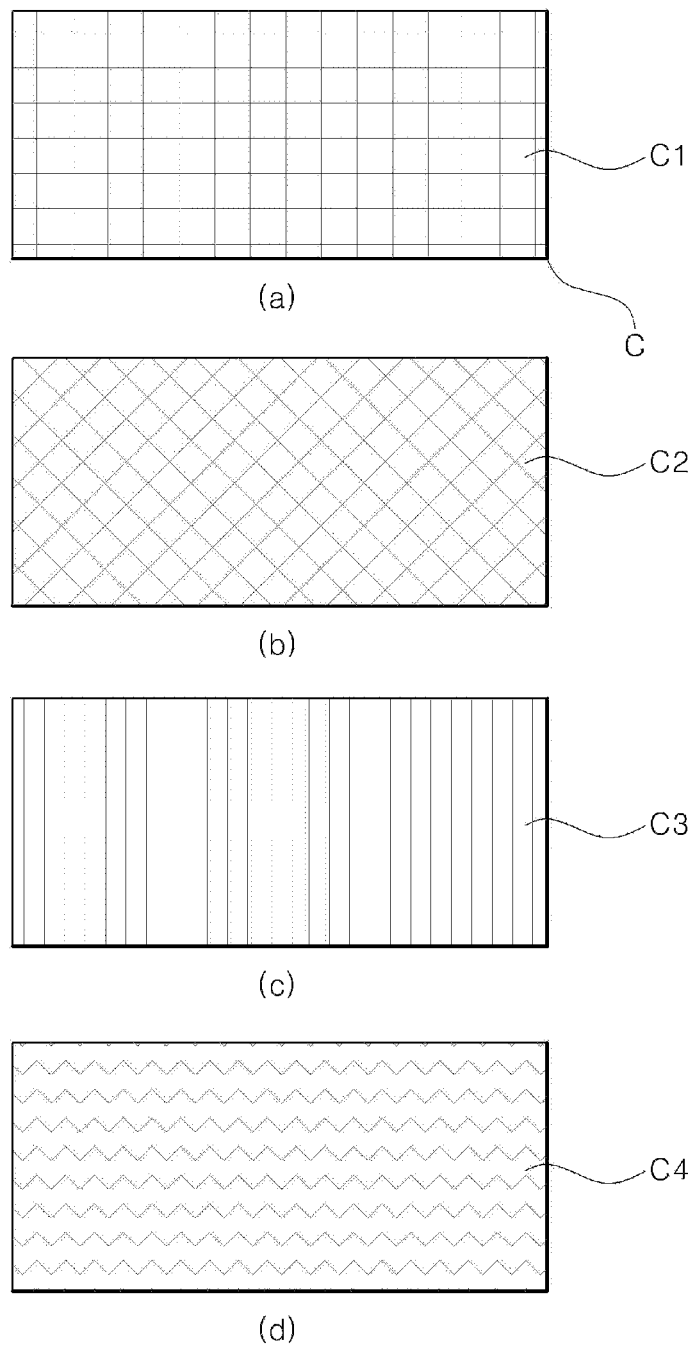
Figure 8:
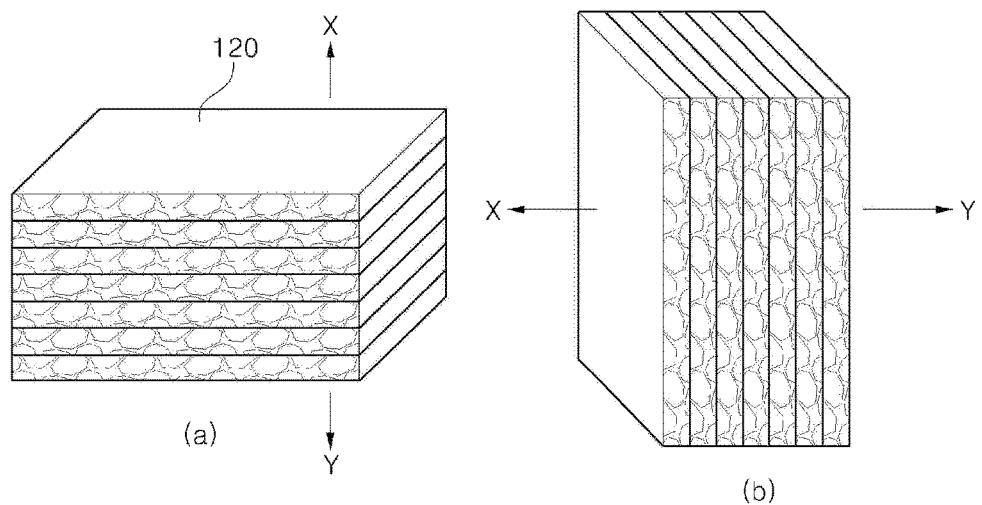
FIG. 8 is a conceptual diagram of another structure of a thermoelectric module according to an embodiment.
Figure 8:
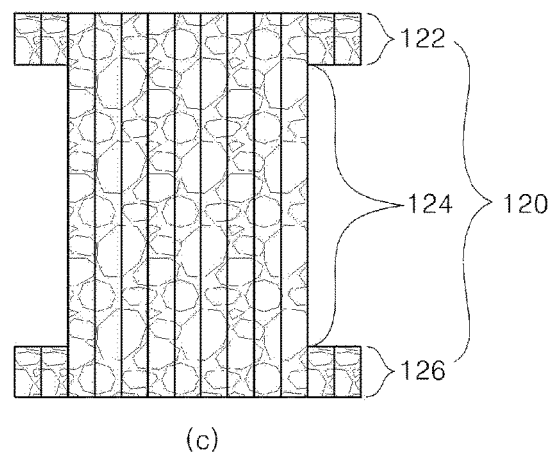

FIGS. 6 to 8 are other examples of the thermoelectric device according to embodiments shown in FIGS. 1 to 5. For example, in another embodiment, a structure of the semiconductor device described above may be a stack-type structure rather than the bulk-type structure so as to be slimmer and to further enhance cooling efficiency.

For example, as shown in FIG. 6, the first semiconductor device 120 and the second semiconductor device 130 may be formed as a unit in which a plurality of structures coated with a semiconductor material are stacked on a sheet-shaped base material, and then the unit may be cut so that a loss of a material may be prevented and electrical conductivity may be enhanced.

FIG. 6 illustrates a conceptual diagram of fabricating the unit of the stack-type structure described above. According to FIG. 6, a material including a semiconductor material may be fabricated in a paste form, the paste may be coated on a base material 111, such as a sheet, a film, and the like, to form a semiconductor layer 112, and a unit 110 may be formed. In the unit 110, as shown in FIG. 6, a plurality of members 110a, 110b, 110c, and 110d may be stacked to form a stack-type structure, and then the stack-type structure may be cut to form a unit thermoelectric device 120. That is, the unit thermoelectric device 120 may be formed as a structure in which a plurality of members 110a, 110b, 110c, and 110d, on which the semiconductor layer 112 may be stacked, may be stacked on the base material 111.

In the above-described process, coating the semiconductor paste on the base material 111 may be implemented using various methods, for example, by a tape casting process in which very fine semiconductor material powder may be mixed with any one of a water-based or a non-water-based solvent and a binder, a plasticizer, a dispersant, a defoaming agent, and a surface active agent to form slurry, and then perform shaping with a uniform thickness according to a desired purpose on a moving blade or a moving conveyance base material. The base material 111 may use a material such as a film, a sheet, and the like, having a thickness in the range of 10 to 100 μm, and the P-type material and N-type material used in fabricating the above-described bulk-type device may also be applied to the coated semiconductor material.

In aligning and stacking the unit 110 in multiple layers, the unit 110 may be formed as a stack-type structure by pressing at a temperature of 50 to 250° C., and the number of the members 110a, 110b, 110c, and 110d stacked may be in the range of about 2 to 50. Then, a cutting process may be performed according a desired shape and size, and a sintering process may be added.

The unit thermoelectric device formed by stacking a multitude of the members 110a, 110b, 110c, and 110d based on the above-described process may have uniformity in thickness and shape. For example, in a thermoelectric device having a bulk shape, after a process of ingot pulverization and a refining ball-mill process, a sintered bulk structure may be cut, and a lot of material may be lost in the cutting process. Furthermore, cutting with or into a uniform size may be difficult, and a thickness may be about 3 to 5 mm, which is thick, and thus, hard to make slim. However, in the unit thermoelectric device with a stack-type structure according to the embodiment, after a multitude of members having a sheet shape are stacked, the sheet stacking material may be cut, and little material lost. The material may have a uniform thickness, and uniformity of the material may be obtained, and slimness may be achieved as the thickness of the unit thermoelectric device may be 1.5 mm or less. Thus, application with various shapes may be possible. A final structure for the structure of the thermoelectric device according to embodiments described above with reference to FIGS. 1 to 4 may be implemented by cutting in a cylindrical structure, a cubic structure, or a rectangular parallelepiped structure, or by implementing the shape of the structure of FIG. 5 and cutting in a shape of the structure in FIG. 6(d).

In the fabrication process of the thermoelectric device according to the embodiment, a process of forming a conductive layer on a surface of the unit 110 may be further included in a process of forming a stack structure of the unit 110. That is, conductive layers having a structure as shown in FIG. 7 may be formed between two members of the stack structure of FIG. 6(c). The conductive layer may be formed on a surface opposite a base material surface on which a semiconductor layer is formed, and the conductive layers may be formed as patterned layers so that a region in which a surface of the member may be exposed may be formed. Thus, electrical conductivity may be enhanced. Compared to when an entire surface is coated, an adhesive force between the respective members may be enhanced, and an advantage of decreasing thermal conductivity may be implemented.

FIG. 7 illustrates various modified examples of a conductive layer C according to an embodiment, and a pattern in which a surface of the member is exposed may be designed with various modifications, such as, e.g., a mesh-type structure including enclosed-type opening patterns C1 and C2 as shown in FIGS. 7(a) and 7(b), or a line-type structure including open-type opening patterns C3 and C4 as shown in FIGS. 7(c) and 7(d). The conductive layer described above not only may increase an adhesive force between the respective members inside a unit thermoelectric device in which members are formed in a stack structure, but also may have advantages of decreasing thermal conductivity and enhancing electrical conductivity. Therefore, compared to a bulk-type thermoelectric device, a cooling capacity (Qc) and a temperature difference ($\Delta T$) (° C.) may be enhanced, and a power factor may be increased by 1.5 times, that is, the electrical conductivity may be increased by 1.5 times. The increase in the electrical conductivity may be directly related to an increase in the thermoelectric efficiency, and therefore, cooling efficiency may be increased. The conductive layer may be formed of a metallic material, and all metal-based electrode materials, such as Cu, Ag, Ni, and the like, may be applied.

When the unit thermoelectric device of a stack-type structure described in FIG. 6 is applied to the thermoelectric module shown in FIGS. 1 to 5, that is, when the thermoelectric device according to the embodiment is provided between the first substrate 140 and the second substrate 150 and the thermoelectric module is implemented with a unit cell of a structure including an electrode layer, an overall thickness (Th) may be formed in the range of 1 to 1.5 mm. Therefore, a noticeable slimness may be realized when compared to the thermoelectric module using a bulk-type device.

Further, the thermoelectric devices 120 and 130 described above with reference to FIG. 6 may be aligned to be horizontally provided in an upper direction X and a lower direction Y as shown in FIG. 8(a), and then may be cut as shown in FIG. 8(c) to form the thermoelectric module according to the embodiment.

In the structure of FIG. 8©, a thermoelectric module may be formed to have a structure in which the first substrate 140, the second substrate 150, a semiconductor layer, and a surface of the base material 111 may be adjacent, but may be formed to have a structure in which a side surface of the unit thermoelectric device may be provided adjacent to the first substrate 140 and the second substrate 150 by vertically standing the thermoelectric device itself, as shown in FIG. 8(b). In the structure as described above, an end portion of a conductive layer may be exposed on a side portion compared to a horizontally provided structure, thermal conductivity efficiency in a vertical direction may be decreased, electrical conductivity efficiency may be increased, and cooling efficiency may be further increased.

As described above, in the thermoelectric device applied to the thermoelectric module of the embodiment, shapes and sizes of the first semiconductor device and the second semiconductor device provided opposite each other may be the same. However, in this case, considering that the electrical conductivity properties of a P-type semiconductor device and an N-type semiconductor device are different, and this functions as a factor to decrease a cooling efficiency, a volume of one semiconductor device may be different from a volume of the other semiconductor provided opposite the one semiconductor device, and therefore, may also enhance the cooling efficiency.

That is, volumes of semiconductor devices provided opposite each other may be implemented by forming different overall shapes from each other, forming a diameter of a cross-section of one side greater in semiconductor devices having the same height, or forming different heights or diameters of cross-sections in semiconductor devices having the same shape. For example, the thermoelectric efficiency may be enhanced by forming a diameter of the N-type semiconductor device greater than that of the P-type semiconductor device to increase volume.

The thermoelectric device having various structures according to embodiments disclosed herein and the thermoelectric module including the thermoelectric device may be used in an electricity generation module as described above, or to absorb heat of a medium such as water, liquid or the like on the basis of properties of a heat generating portion and a heat absorbing portion on surfaces of an upper substrate and a lower substrate, or to transfer the heat to a specific medium for heating. That is, in the thermoelectric module according to embodiments disclosed herein, a structure of a cooling device that enhances the cooling efficiency is described as an example. However, in a substrate provided opposite the substrate in which cooling is performed, the thermoelectric module may be applied to a device that uses the thermoelectric module for heating a medium using a heat generation property. That is, one device may be applied to an apparatus implementing cooling and heating functions at the same time.

According to embodiments disclosed herein, efficiency of the thermoelectric module may be enhanced by enlarging an area in which thermoelectric devices may be provided. Detaching of wires may be prevented and the wires may be stably supported. The thermoelectric module may be a slim thermoelectric module having a high radiation effect and high efficiency.

Further, a thermoelectric device in which a cooling capacity (Qc) and a temperature difference (ΔT) may be noticeably enhanced by decreasing the thermal conductivity and enhancing the electrical conductivity, and a thermoelectric module including the thermoelectric device may be provided.

According to embodiments disclosed herein, a thermoelectric module may include a first substrate including a plurality of first electrodes, a second substrate provided opposite the first substrate and including a plurality of second electrodes, a plurality of thermoelectric devices provided between the first substrate and the second substrate and electrically connected to the first electrodes and the second electrodes, and a wire connection hole configured to penetrate through at least one of the first substrate and the second substrate, and expose a portion of one surface of at least one of the first electrodes and the second electrodes.

The wire connection hole may include a pair of wire connection holes exposing respective different electrodes. The different electrodes may be connected to respective different types of thermoelectric devices. One hole of the pair of wire connection holes may expose an electrode connected to a P-type thermoelectric device, and the other hole of the pair of wire connection holes may expose an electrode connected to an N-type thermoelectric device.

The thermoelectric module may further include a guide groove formed on one surface of a substrate on which the wire connection hole may be formed. The guide groove may be formed from the wire connection hole to a side surface of the substrate. The guide groove may be formed to be bended from the wire connection hole to the side surface of the substrate. A width of the guide groove may be smaller than a diameter of the wire connection hole. More than two guide grooves may be formed from one wire connection hole.

The plurality of thermoelectric devices may include a P-type thermoelectric device and an N-type thermoelectric device. The thermoelectric module may further include a wire connected to the one surface exposed by the wire connection hole and pulled out to the outside through the wire connection hole. Both of a P-type thermoelectric device and an N-type thermoelectric device may be provided on each electrode exposed by the wire connection hole. An insulation layer may be formed on an inner wall of the wire connection hole. A heat converter according to an embodiment may include the thermoelectric module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thermoelectric module, comprising:
a first substrate including a plurality of first electrodes;
a second substrate provided opposite the first substrate and including a plurality of second electrodes, the second substrate including a top surface and a bottom surface spaced apart in a first direction, a first side surface and a second side surface spaced apart in a second direction, a first end surface and a second end surface spaced apart in a third direction, wherein the first end surface is between the first side surface and the second side surface, the first end surface is between the top surface and the bottom surface, and the first, second, and third directions are mutually orthogonal;
a plurality of thermoelectric devices provided between the first substrate and the top surface of the second substrate, the plurality of thermoelectric devices are electrically connected to the plurality of first electrodes and the plurality of second electrodes;
a first wire connection hole that extends in the first direction from the bottom surface of the second substrate to the top surface of the second substrate to expose a portion of one surface of a first electrode section of the plurality of second electrodes;
a first guide groove that extends in the second direction from the first wire connection hole to the first side surface of the second substrate;

a second guide groove that extends in the third direction from the first wire connection hole to the first end surface of the second substrate;

wherein the first guide groove and the second guide groove are each a structure comprising two opposing lateral sides, a top surface, and an opening opposite the top surface, wherein a first portion of the first end surface is provided between the second guide groove and the first side surface, and a second portion of the first end surface is provided between the second guide groove and the second side surface, wherein a wire is pulled out through the first wire connection hole, the first guide groove is configured to guide the wire from the first wire connection hole to the first side surface of the second substrate or the second guide groove is configured to guide the wire from the first wire connection hole to the first end surface of the second substrate, and wherein a width of the first guide groove is smaller than a diameter of the first wire connection hole.

2. The thermoelectric module of claim 1, further comprising a second wire connection hole, the second wire connection hole exposing a second electrode section of the plurality of second electrodes.

3. The thermoelectric module of claim 2, wherein the first electrode section and the second electrode section of the plurality of second electrodes are connected to respective different conductivity types of the plurality of thermoelectric devices.

4. The thermoelectric module of claim 3, wherein one of the first electrode section and the second electrode section of the plurality of second electrodes is connected to a P-type thermoelectric device, and the other of the first electrode section and the second electrode section of the plurality of second electrodes is connected to a N-type thermoelectric device.

5. The thermoelectric module of claim 1, wherein the first guide groove is formed in a bending shape to be bended from the first wire connection hole to the first side surface of the second substrate.

6. The thermoelectric module of claim 1, wherein the plurality of thermoelectric devices include a P-type thermoelectric device and an N-type thermoelectric device.

7. The thermoelectric module of claim 1, wherein a P-type thermoelectric device and an N-type thermoelectric device in the plurality of thermoelectric devices are both provided on the first electrode section of the plurality of second electrodes exposed by the first wire connection hole.

8. The thermoelectric module of claim 1, wherein an insulation layer is formed on an inner wall of the first wire connection hole.

9. A heat converter comprising the thermoelectric module of claim 1.

* * * * *